United States Patent
Chiang et al.

[11] Patent Number: 5,922,515
[45] Date of Patent: Jul. 13, 1999

[54] APPROACHES TO INTEGRATE THE DEEP CONTACT MODULE

[75] Inventors: Wen-Chuan Chiang; Tse-Liang Ying, both of Hsin-chu, Taiwan

[73] Assignee: Taiwan Semiconductor Manufacturing Company, Ltd., Hsin-Chu, Taiwan

[21] Appl. No.: 09/031,684

[22] Filed: Feb. 27, 1998

[51] Int. Cl.⁶ .................................................. G03F 7/00
[52] U.S. Cl. .......................... 430/312; 430/314; 438/692
[58] Field of Search ................................ 430/312, 314; 438/692

[56] References Cited

U.S. PATENT DOCUMENTS

| | | | |
|---|---|---|---|
| 5,091,339 | 2/1992 | Carey | 437/187 |
| 5,173,442 | 12/1992 | Carey | 437/173 |
| 5,330,879 | 7/1994 | Dennison | 430/313 |
| 5,834,159 | 11/1998 | Stolmeiger | 430/312 |

*Primary Examiner*—Janet Baxter
*Assistant Examiner*—Barbara Gilmore
*Attorney, Agent, or Firm*—George O. Saile; Stephen B. Ackerman; Rosemary L. S. Pike

[57] ABSTRACT

A method of improving the deep contact processing window is described. Semiconductor device structures in and on a semiconductor substrate are covered with a dielectric layer. A polysilicon layer is deposited overlying the dielectric layer. The polysilicon layer is etched away where it is not covered by a photoresist mask to form a polysilicon hard mask. A contact opening is etched through the dielectric layer to the semiconductor substrate where the deep contact is to be made where the dielectric layer is not covered by the polysilicon hard mask. Thereafter the photoresist mask is removed. A photoresist layer is deposited overlying the polysilicon hard mask and filling the contact opening. The polysilicon hard mask and the photoresist layer not within the contact opening are polished away wherein the photoresist layer remaining within the contact opening protects the contact opening from contamination during polishing. Thereafter, the photoresist layer within the contact opening is removed and a metal layer is deposited within the contact opening to complete the deep contact in the fabrication of an integrated circuit device.

20 Claims, 3 Drawing Sheets

APPROACHES TO INTEGRATE THE DEEP CONTACT MODULE

BACKGROUND OF THE INVENTION (1) Field of the Invention

The present invention relates to the fabrication of integrated circuit devices, and more particularly, to a method of improving the deep contact processing window in the fabrication of integrated circuits.

(2) Description of the Prior Art

In the fabrication of integrated circuit devices, it is sometimes necessary to form a deep contact hole with deep submicron feature sizes and high aspect ratios; that is, a contact opening in which the ratio of height to width of the opening is much greater than one. High density plasma etchers must be used to form these deep contact holes. However, the low selectivity of photoresist to inter-layer dielectrics makes complete etching of the deep contact holes impossible. It is necessary to implement a hard mask in order to achieve complete etching. It is also necessary to provide a process that will result in clean etching of the deep contact holes without contaminants that will cause high contact resistance.

U.S. Pat. No. 5,330,879 to Dennison shows a method of fabricating close-tolerance lines in which a masking material is deposited within a void, following by chemical mechanical polishing (CMP), and then etching away all material except for the filled void and underlying layer to form the close-tolerance lines. U.S. Pat. Nos. 5,173,442 and 5,091,339 to Carey show methods of forming vias and channels in insulating layers using masks and CMP processes.

SUMMARY OF THE INVENTION

Accordingly, it is a primary object of the present invention to provide an effective and very manufacturable method for improving the deep contact processing window in the fabrication of integrated circuits.

It is a further object of the invention to provide a process for improving the deep contact processing window by using a polysilicon hard mask.

Yet another object is to fill the deep contact hole with a photoresist material during polishing to prevent contaminants from entering the contact hole.

Yet another object is to provide a process for improving the deep contact processing window by using a polysilicon hard mask for etching the deep contact hole and then filling the deep contact hole with a photoresist material during polishing to prevent contaminants from entering the contact hole.

In accordance with the objects of the invention, a method of improving the deep contact processing window by using a polysilicon hard mask for etching the deep contact hole and then filling the deep contact hole with a photoresist material during polishing is achieved. Semiconductor device structures in and on a semiconductor substrate are covered with a dielectric layer. A polysilicon layer is deposited overlying the dielectric layer. The polysilicon layer is etched away where it is not covered by a photoresist mask to form a polysilicon hard mask. A contact opening is etched through the dielectric layer to the semiconductor substrate where the deep contact is to be made where the dielectric layer is not covered by the polysilicon hard mask. Thereafter the photoresist mask is removed. A photoresist layer is deposited overlying the polysilicon hard mask and filling the contact opening. The polysilicon hard mask and the photoresist layer not within the contact opening are polished away wherein the photoresist layer remaining within the contact opening protects the contact opening from contamination during polishing. Thereafter, the photoresist layer within the contact opening is removed and a metal layer is deposited within the contact opening to complete the deep contact in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
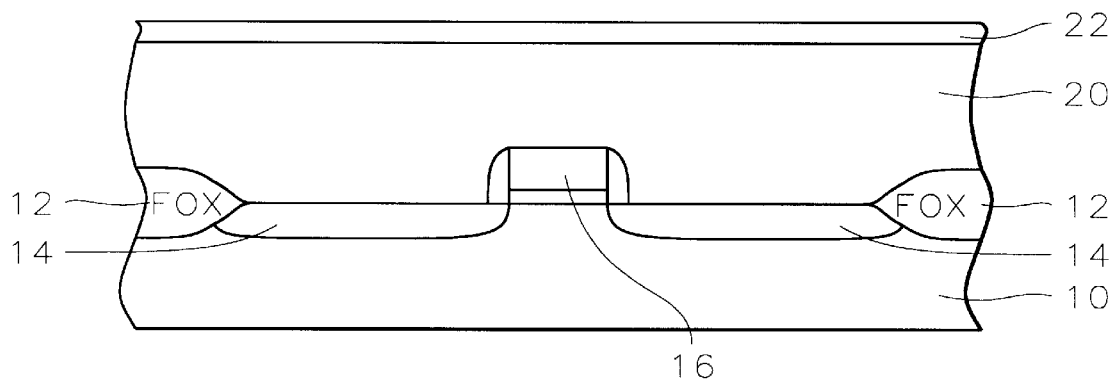
FIGS. 1 through 9 are cross-sectional representations of a preferred embodiment of the present invention.

Referring now more particularly to FIG. 1, there is shown a semiconductor substrate 10, in which may be formed semiconductor device structures which may include polysilicon gate electrode 16 and source and drain regions 14. Active regions may be separated by Field OXide regions 12. Inter-layer dielectric layer 20 is blanket deposited over the semiconductor device structures. This layer may comprise borophospho-tetraethoxysilane (BP-TEOS) oxide, borophosphosilicate glass (BPSG), phosphosilicate glass (PSG), or a combination of BPSG and silicon dioxide, and so on, and may be one or more layers. The total thickness of the layer 20 is typically between about 10,000 and 30,000 Angstroms. The top of the inter-layer dielectric layer 20 is planarized, for example by reflowing of the dielectric material, etchback, or chemical mechanical polishing (CMP), or the like.

A layer of polysilicon 22 is deposited over the planarized inter-layer dielectric layer 20 by chemical vapor deposition (CVD) to a thickness of between about 500 and 5000 Angstroms. This polysilicon layer 22 will act as the hard mask for the deep contact etch.

Figure 2:
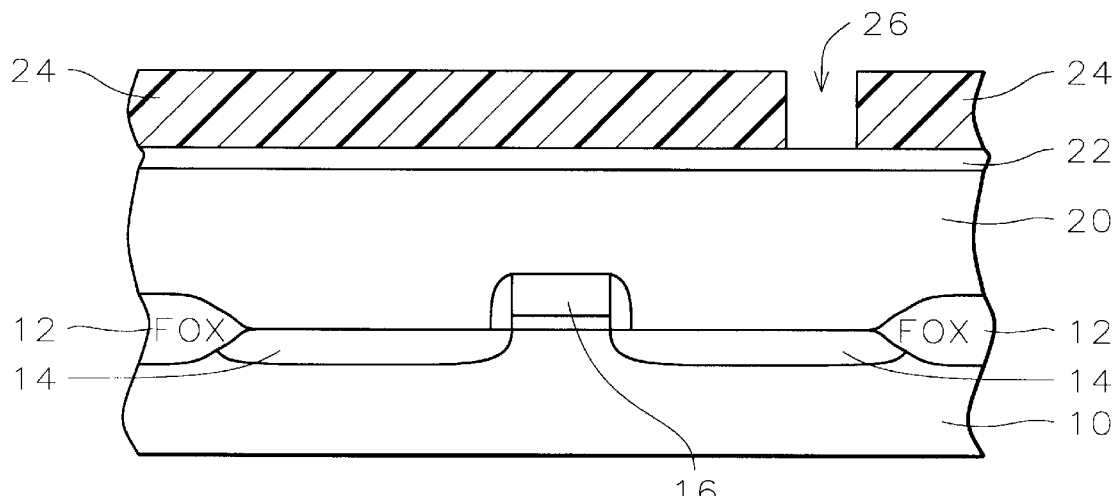

Referring now to FIG. 2, a layer of photoresist is coated over the polysilicon layer. The photoresist layer is exposed, developed, and patterned to form the photoresist mask 24 defining contact openings such as opening 26. The photoresist mask 24 is now hard baked at a temperature of between about 80 and 180° C. for 5 to 10 minutes or cured in ultraviolet light for about 1 minute in order to improve its surface hardness and stability.

Figure 3:
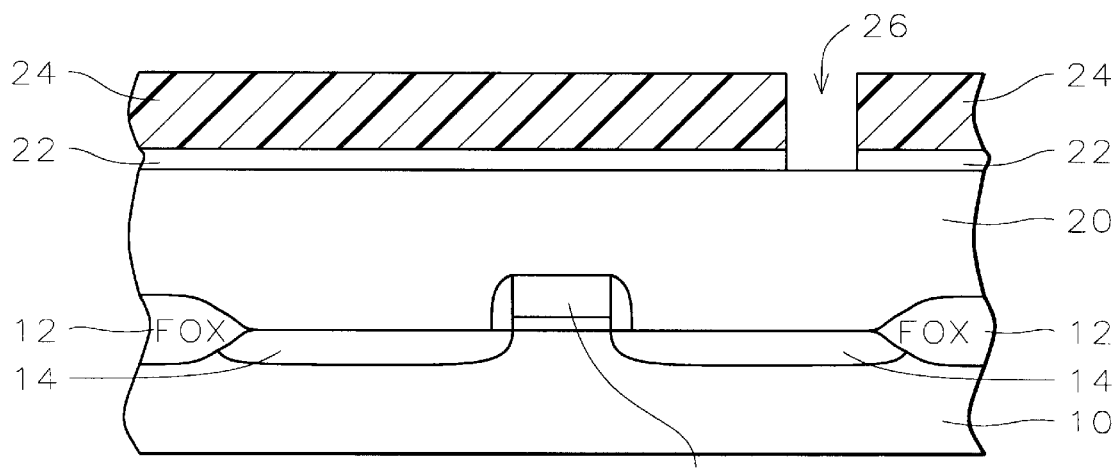

Referring now to FIG. 3, the polysilicon layer 22 is etched away where it is not covered by the photoresist mask 24 with an etch stop at the interlevel dielectric layer 20. This forms the polysilicon hard mask of the present invention. The polysilicon layer is etched by wet or dry etching.

Figure 4:
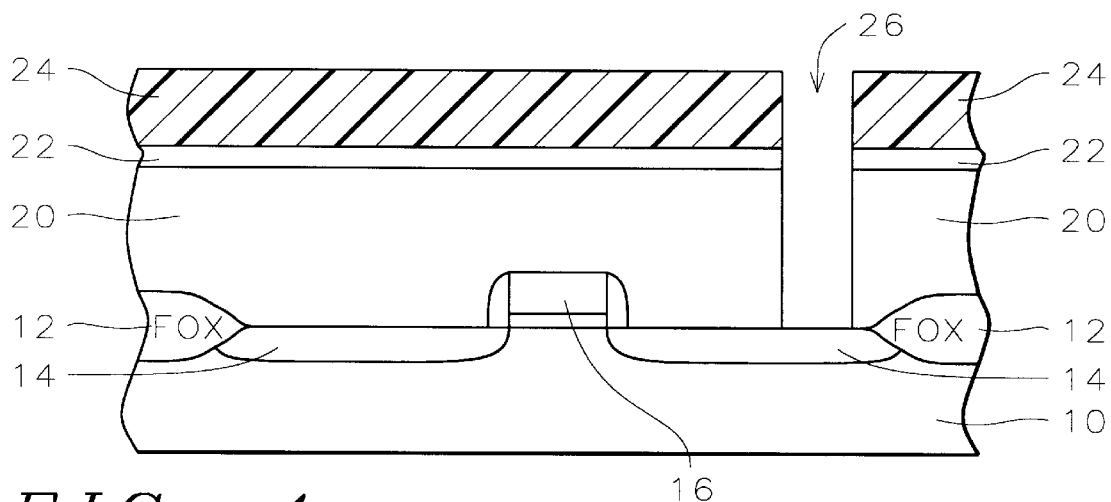

Next, as shown in FIG. 4, the inter-layer dielectric layer 20 is etched through to the underlying semiconductor device structure to be contacted, such as the source/drain junction 14 in the semiconductor substrate. Because of the thickness of the inter-layer dielectric 20, the contact opening 26 is deep with a high aspect ratio. That is, the depth of the opening is much greater than the width of the opening.

Figure 5:
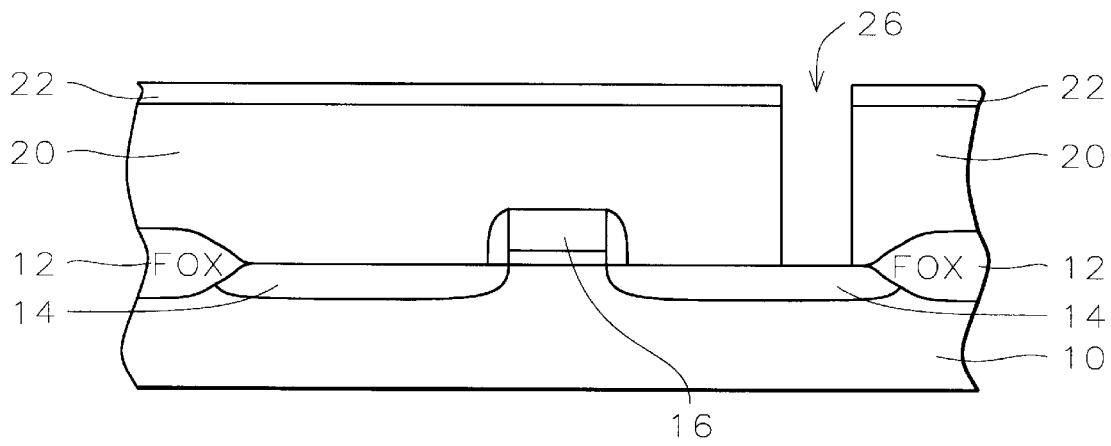

The photoresist mask 24 is stripped, for example, using oxygen ashing or wet etching, as shown in FIG. 5.

Figure 6:
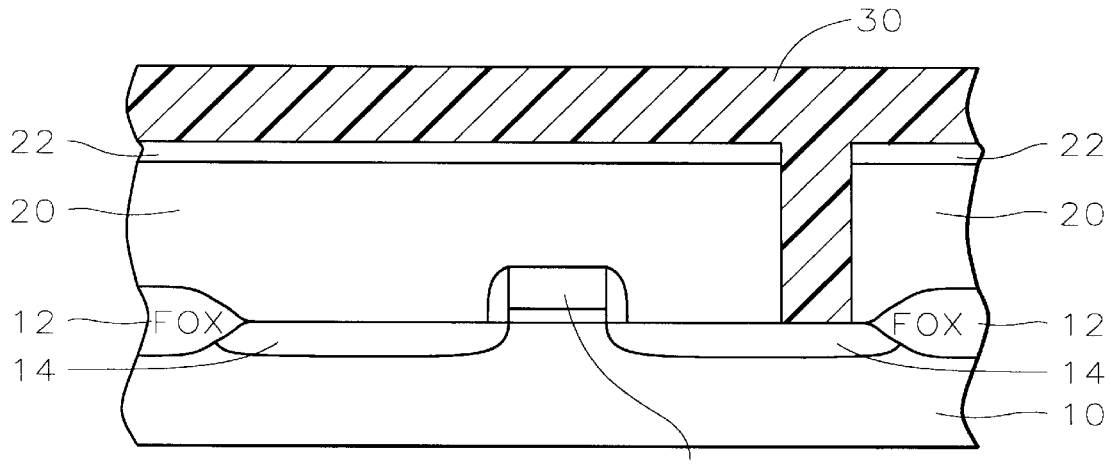

Referring now to FIG. 6, a second layer of photoresist 30 is coated over the polysilicon layer 22 and filling the contact opening 26. Again, the photoresist layer 30 is hard baked or cured in ultra-violet light, as described above.

Figure 7:
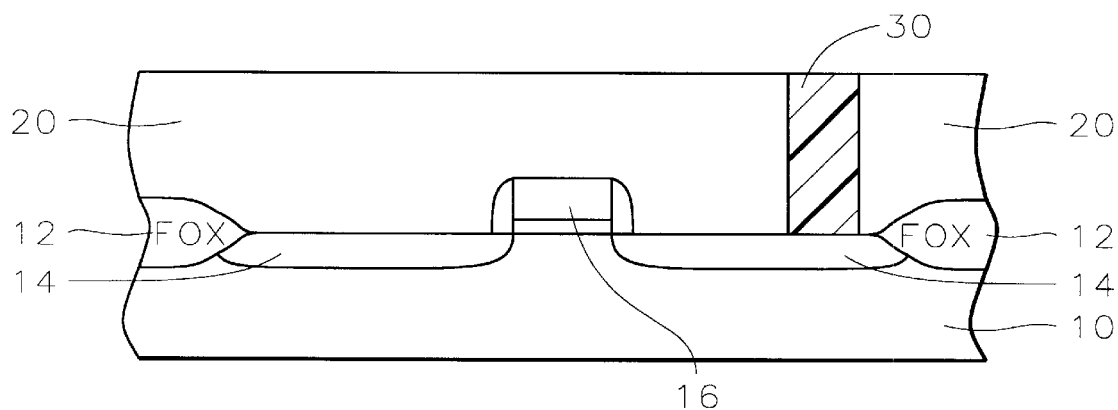

The photoresist 30 and the polysilicon layer 22 are removed by chemical mechanical polishing (CMP), as illustrated in FIG. 7. Using CMP to polish away the hard mask is easily compatible with the current manufacturing process flow. The photoresist 30 remaining within the contact hole protects the contact hole from the contamination of slurry and crumbs from the CMP process. Thus, the difficulty of cleaning the polish residue out of the contact hole is avoided.

Figure 8:
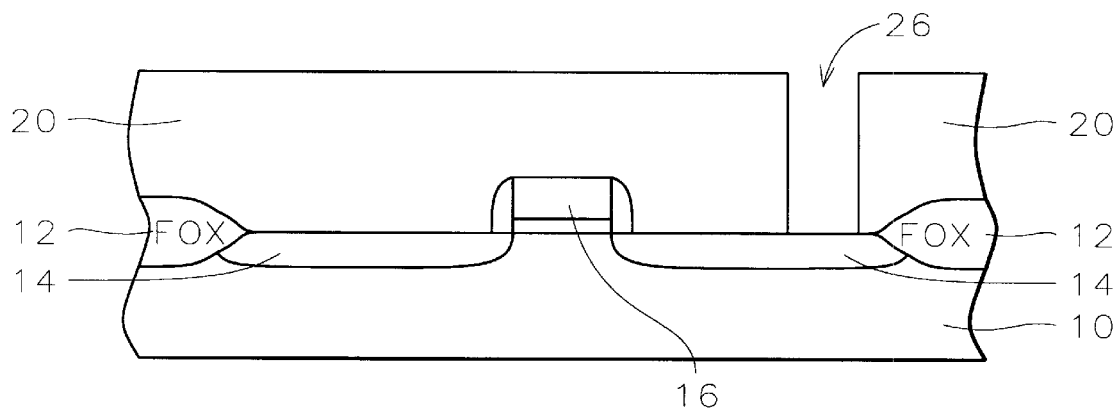

The sacrificial photoresist layer 30 within the contact hole is now removed by wet etching, as shown in FIG. 8. The bottom of the contact opening 26 has been protected from contamination during CMP, resulting in reduced contact resistance.

Figure 9:
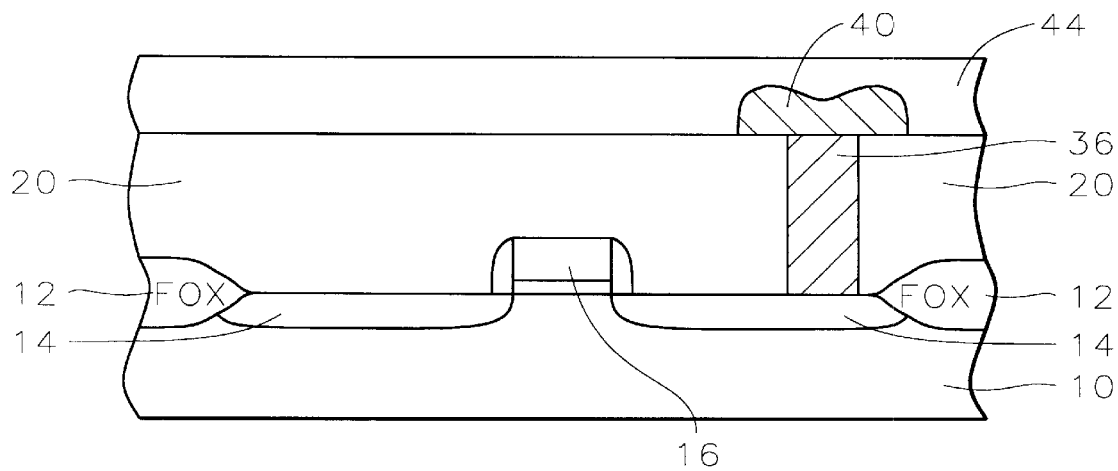

Processing continues as is conventional in the art to fill the contact openings. For example, tungsten is deposited and etched back to form tungsten plug 36, as illustrated in FIG. 9. A layer of aluminum or AlSiCu 40 is deposited and patterned and passivated with dielectric layer 44 to complete the electrical connections for the integrated circuit device to be fabricated.

The process of the present invention greatly improves the deep contact processing window for any integrated circuit devices in which deep or high aspect ratio contacts are needed. The process of the present invention can be used for contacts without enough of an interlevel dielectric layer to photoresist etching selectivity to open contacts completely. Contacts may have an aspect ratio of greater than 4, typically, but the aspect ratio may be as high as 7. The process of the present invention easily integrates the hard mask process into the deep contact module. The polysilicon hard mask is simple to form and to remove by CMP. The sacrificial photoresist material coated within the contact opening protects the contact opening from contaminants during the CMP step to remove the polysilicon hard mask. The photoresist material within the contact opening is then easily removed resulting in a clean contact opening with reduced contact resistance.

While the invention has been particularly shown and described with reference to the preferred embodiments thereof, it will be understood by those skilled in the art that various changes in form and details may be made without departing from the spirit and scope of the invention.

What is claimed is:

1. A method of forming a deep contact in the fabrication of an integrated circuit comprising:

providing semiconductor device structures in and on a semiconductor substrate;

covering said semiconductor device structures with a dielectric layer;

depositing a polysilicon layer overlying said dielectric layer;

forming a photoresist mask overlying said polysilicon layer;

etching away said polysilicon layer not covered by said photoresist mask to form a polysilicon hard mask;

etching a contact opening through said dielectric layer to said semiconductor substrate where said deep contact is to be made where said dielectric layer is not covered by said polysilicon hard mask;

thereafter removing said photoresist mask;

depositing a photoresist layer overlying said polysilicon hard mask and filling said contact opening;

polishing away said polysilicon hard mask and said photoresist layer not within said contact opening wherein said photoresist layer remaining within said contact opening protects said contact opening from contamination during said polishing;

thereafter removing said photoresist layer within said contact opening; and depositing a metal layer within said contact opening to complete said deep contact in the fabrication of said integrated circuit device.

2. The method according to claim 1 wherein said semiconductor device structures include gate electrodes and source and drain regions.

3. The method according to claim 1 wherein said dielectric layer has a thickness of between about 10,000 and 30,000 Angstroms.

4. The method according to claim 1 wherein said dielectric layer comprises multiple layers having a combined thickness of between about 10,000 and 30,000 Angstroms.

5. The method according to claim 1 wherein said polysilicon layer has a thickness of between about 500 and 5000 Angstroms.

6. The method according to claim 1 wherein said contact opening has an aspect ratio of greater than one.

7. The method according to claim 1 wherein said polishing comprises chemical mechanical polishing.

8. The method according to claim 1 wherein said photoresist layer remaining within said contact opening is removed by etching.

9. A method of forming a deep contact in the fabrication of an integrated circuit comprising:

providing semiconductor device structures in and on a semiconductor substrate;

covering said semiconductor device structures with a dielectric layer;

depositing a polysilicon layer overlying said dielectric layer;

coating a first photoresist layer overlying said polysilicon layer and patterning said first photoresist layer to form a photoresist mask;

etching away said polysilicon layer not covered by said photoresist mask to form a polysilicon hard mask;

etching a contact opening through said dielectric layer to said semiconductor substrate where said deep contact is to be made where said dielectric layer is not covered by said polysilicon hard mask;

thereafter removing said photoresist mask;

depositing a second photoresist layer overlying said polysilicon hard mask and filling said contact opening;

polishing away said polysilicon hard mask and said second photoresist layer not within said contact opening wherein said second photoresist layer remaining within said contact opening protects said contact opening from contamination during said polishing;

thereafter removing said second photoresist layer within said contact opening; and depositing a metal layer within said contact opening to complete said deep contact in the fabrication of said integrated circuit device.

10. The method according to claim 9 wherein said semiconductor device structures include gate electrodes and source and drain regions.

11. The method according to claim 9 wherein said dielectric layer has a thickness of between about 10,000 and 30,000 Angstroms.

12. The method according to claim 9 wherein said dielectric layer comprises multiple layers having a combined thickness of between about 10,000 and 30,000 Angstroms.

13. The method according to claim 9 wherein said polysilicon layer has a thickness of between about 500 and 5000 Angstroms.

14. The method according to claim 9 wherein said contact opening has an aspect ratio of greater than four.

15. The method according to claim 9 wherein said polishing comprises chemical mechanical polishing.

16. The method according to claim 9 wherein said second photoresist layer remaining within said contact opening is removed by etching.

17. A method of forming a deep contact having an aspect ratio greater than four in the fabrication of an integrated circuit comprising:

providing semiconductor device structures in and on a semiconductor substrate;

covering said semiconductor device structures with a dielectric layer;

depositing a polysilicon layer overlying said dielectric layer;

coating a first photoresist layer overlying said polysilicon layer and patterning said first photoresist layer to form a photoresist mask;

etching away said polysilicon layer not covered by said photoresist mask to form a polysilicon hard mask;

etching a contact opening through said dielectric layer to said semiconductor substrate where said deep contact is to be made where said dielectric layer is not covered by said polysilicon hard mask;

thereafter removing said photoresist mask;

depositing a second photoresist layer overlying said polysilicon hard mask and filling said contact opening;

polishing away said polysilicon hard mask and said second photoresist layer not within said contact opening using chemical mechanical polishing wherein said second photoresist layer remaining within said contact opening protects said contact opening from contamination during said polishing;

thereafter removing said second photoresist layer within said contact opening; and depositing a metal layer within said contact opening to complete said deep contact in the fabrication of said integrated circuit device.

18. The method according to claim 17 wherein said semiconductor device structures include gate electrodes and source and drain regions.

19. The method according to claim 17 wherein said dielectric layer has a thickness of between about 10,000 and 30,000 Angstroms.

20. The method according to claim 17 wherein said polysilicon layer has a thickness of between about 500 and 5000 Angstroms.

* * * * *